(12) United States Patent
Viegas

(10) Patent No.: US 9,020,165 B2
(45) Date of Patent: Apr. 28, 2015

(54) POP/CLICK NOISE REDUCTION CIRCUITRY FOR POWER-UP AND POWER-DOWN OF AUDIO OUTPUT CIRCUITRY

(71) Applicant: Silicon Laboratories Inc., Austin, TX (US)

(72) Inventor: Eduardo Viegas, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 417 days.

(21) Appl. No.: 13/647,897

(22) Filed: Oct. 9, 2012

(65) Prior Publication Data

US 2014/0098974 A1    Apr. 10, 2014

(51) Int. Cl.
| H04B 15/00 | (2006.01) |
| H03G 3/34 | (2006.01) |
| H03F 1/02 | (2006.01) |
| H03F 1/30 | (2006.01) |
| H03F 3/187 | (2006.01) |
| H03F 3/45 | (2006.01) |

(52) U.S. Cl.
CPC .............. *H04B 15/00* (2013.01); *H03G 3/348* (2013.01); *H03F 1/0261* (2013.01); *H03F 1/305* (2013.01); *H03F 3/187* (2013.01); *H03F 3/45475* (2013.01); *H03F 3/45968* (2013.01); *H03F 2200/03* (2013.01); *H03F 2200/411* (2013.01); *H03F 2203/45528* (2013.01); *H03F 2203/45594* (2013.01)

(58) Field of Classification Search
USPC ........................................................ 381/94.5
See application file for complete search history.

(56) References Cited

U.S. PATENT DOCUMENTS

| 5,642,076 A | * | 6/1997 | Naokawa et al. ............. 330/149 |
| 5,768,601 A | * | 6/1998 | Tran .............................. 713/300 |
| 7,167,569 B1 | * | 1/2007 | Seven ........................... 381/111 |
| 2004/0204162 A1 | * | 10/2004 | Mendoza et al. .......... 455/569.1 |
| 2005/0140432 A1 | * | 6/2005 | Nair et al. ......................... 330/9 |
| 2005/0195991 A1 | * | 9/2005 | Wang et al. ................... 381/94.5 |
| 2006/0066363 A1 | * | 3/2006 | Ho ................................. 327/108 |
| 2006/0182265 A1 | * | 8/2006 | Sorace et al. ................. 379/395 |
| 2008/0018395 A1 | | 1/2008 | Chi et al. |
| 2008/0049952 A1 | | 2/2008 | Jung et al. |
| 2009/0196435 A1 | | 8/2009 | Miao |
| 2009/0275322 A1 | | 11/2009 | Judge et al. |
| 2010/0158270 A1 | | 6/2010 | Chao et al. |
| 2010/0182087 A1 | | 7/2010 | Hellums |
| 2010/0188155 A1 | | 7/2010 | Nielsen |
| 2010/0321112 A1 | | 12/2010 | Fan et al. |
| 2011/0007912 A1 | * | 1/2011 | Thompson ................... 381/94.5 |
| 2011/0012674 A1 | * | 1/2011 | Midya et al. .................... 330/10 |
| 2013/0002348 A1 | * | 1/2013 | Dhanasekaran .............. 330/149 |

* cited by examiner

*Primary Examiner* — Simon Sing
(74) *Attorney, Agent, or Firm* — Egan, Peterman & Enders LLP.

(57) ABSTRACT

Pop/clock noise reduction circuitry is disclosed for audio output circuitry. After audio output circuitry is enabled, reference voltage generator circuitry is then enabled to produce a reference voltage that ramps from a first voltage level to a second voltage level at a smooth rate. The ramping reference voltage is applied to the input of the audio output circuitry to reduce or prevent pop/click noise for the audio output circuitry. Further, negative offset control circuitry can also be used to provide a negative offset input to the audio output circuitry to remove initial step-up voltage levels that may exist at operational power-up for the audio output circuitry. Still further, current control circuitry can also be used that limits the available current flowing to the output node for the audio output circuitry, thereby further reducing and/or preventing potential pop/click noise in the audio output signals.

22 Claims, 3 Drawing Sheets

US 9,020,165 B2

POP/CLICK NOISE REDUCTION CIRCUITRY FOR POWER-UP AND POWER-DOWN OF AUDIO OUTPUT CIRCUITRY

TECHNICAL FIELD OF THE INVENTION

This invention relates to audio output circuitry and, more particularly, to reducing pop and click noise within audio output signals during power-up and power-down of audio output systems.

BACKGROUND

Audio output circuitry is used to process audio input signals for output to other circuitry such as, for example, audio speakers. Audio output circuitry is often subject to noise generated when operation of the audio output circuitry is first enabled and powering-up to provide amplification of audio input signals. For example, audible pop and click noise can be caused in audio output signals due to transient signals that are generated within the audio output circuitry during this power-up of the audio output circuitry. Similarly, audible pop and click noise can also be generated during power-down of the audio output circuitry. This audible pop/click noise is undesirable, as it can degrade the user experience associated with an audio device that is utilizing the audio output circuitry.

SUMMARY OF THE INVENTION

Systems and methods are disclosed for reducing pop/clock noise for audio output circuitry. After audio amplifier circuitry is enabled, reference voltage generator circuitry is then enabled to produce a reference voltage that ramps from a first voltage level to a second voltage level at a smooth rate. The ramping reference voltage is applied to the input of the audio amplifier circuitry to reduce or prevent pop/click noise for the audio output circuitry. Further, negative offset control circuitry can also be used to provide a negative offset input to the audio amplifier circuitry to remove initial step-up voltage levels that may exist at operational power-up for the audio output circuitry due to undesired offsets from preceding circuitry. Still further, current control circuitry can also be used that limits the available current flowing to the output node for the audio amplifier circuitry and helps to hold output voltages to low levels, thereby further reducing and/or preventing pop/click noise in the audio output signals. Other features and variations could also be implemented, and related systems and methods can be utilized, as desired.

DESCRIPTION OF THE DRAWINGS

It is noted that the appended drawings provide only example embodiments and are, therefore, not to be considered limiting in scope, as other equally effective embodiments can be implemented.

DETAILED DESCRIPTION OF THE INVENTION

Systems and methods are disclosed for reducing pop/clock noise for audio output circuitry. In particular, disclosed embodiments reduce and/or effectively prevent the occurrence of undesired pop/click noise during operational power-up or power-down of audio output circuitry. During audio power-up, the embodiments described below provide a slowly ramping reference voltage to the audio input, provide negative offsets to the audio input, and/or provide controlled bias currents for audio output stage circuitry to reduce and/or prevent pop/click noise. For example, a ramped reference voltage can be used to reduce and/or prevent sharp signal steps that can lead to pop/click noise in audio output circuitry. A negative offset voltage can be used to reduce and/or prevent voltage steps that can lead to pop/clock noise in audio output circuitry. And output bias current control for the audio output circuitry can be used to further prevent voltage steps that can lead to pop/click noise in audio output circuitry. During operational power-down, reverse sequences can be utilized. Thus, as described herein, a reference voltage can be used during power-up and power-down to control the biasing of audio output circuitry to facilitate grounding of audio output voltage signals and to progressively modulate the biasing strength for output stages to steady state levels, thereby reducing or preventing the occurrence of pop/click noise in the audio output signals. Other features and variations could also be implemented, as desired, and related systems and methods can be utilized, as well.

Figure 1:
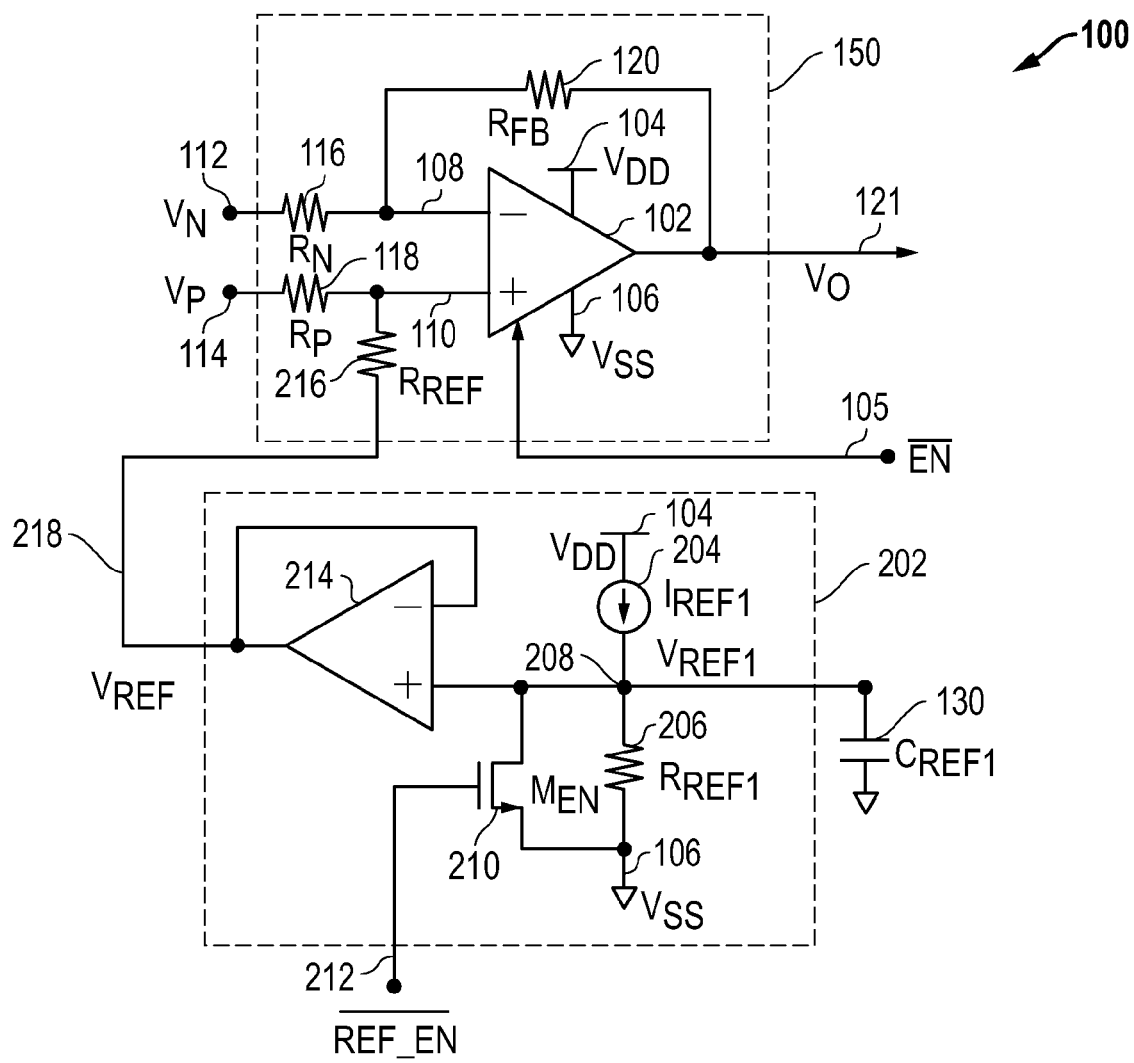
FIG. 1 is a circuit diagram of an example embodiment for audio output circuitry that includes reference voltage generator circuitry that is used to reduce pop/click noise during operational power-up of audio output circuitry.
Figure 2:
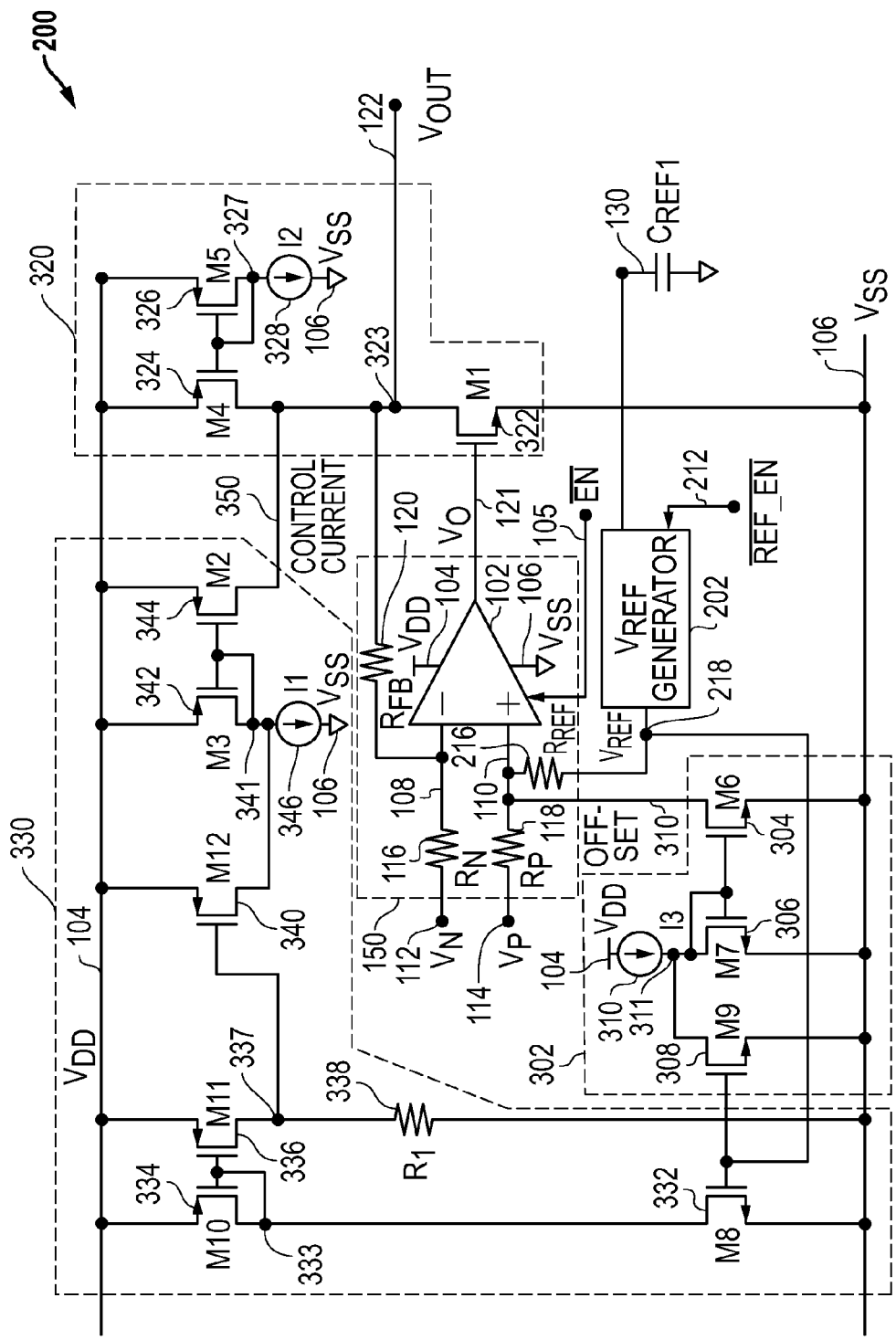
FIG. 2 a circuit diagram of an embodiment that includes voltage offset control circuitry, bias current control circuitry, and power-up control circuitry that is used to reduce pop/click noise during operational power-up of audio output circuitry.
Figure 3:
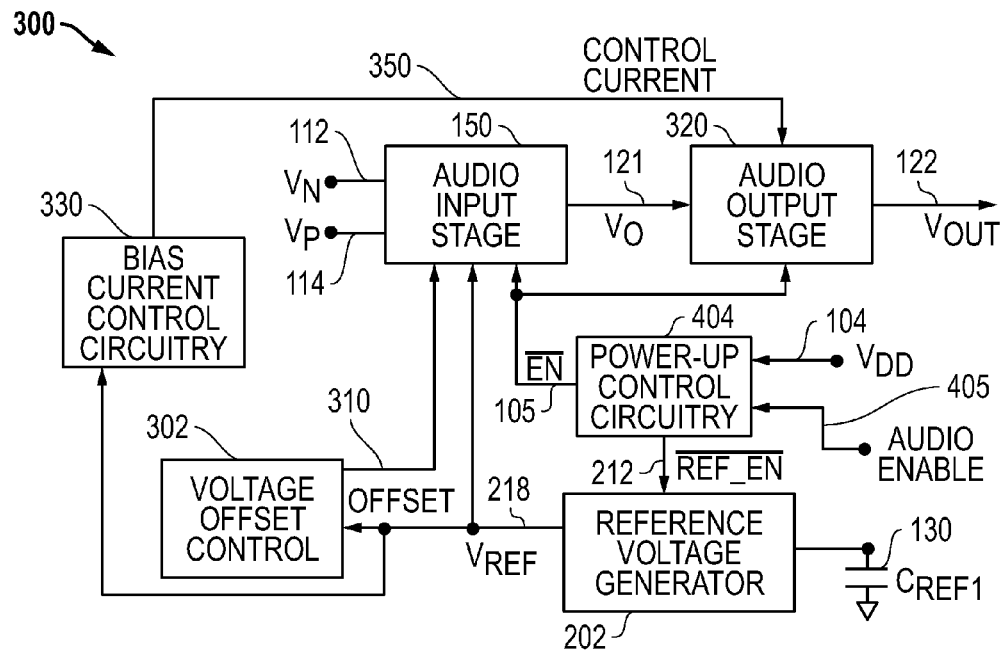
FIG. 3 is a general block diagram of an embodiment that includes circuitry to reduce or eliminate audible clicks/pops for audio output circuitry.
Figure 4:
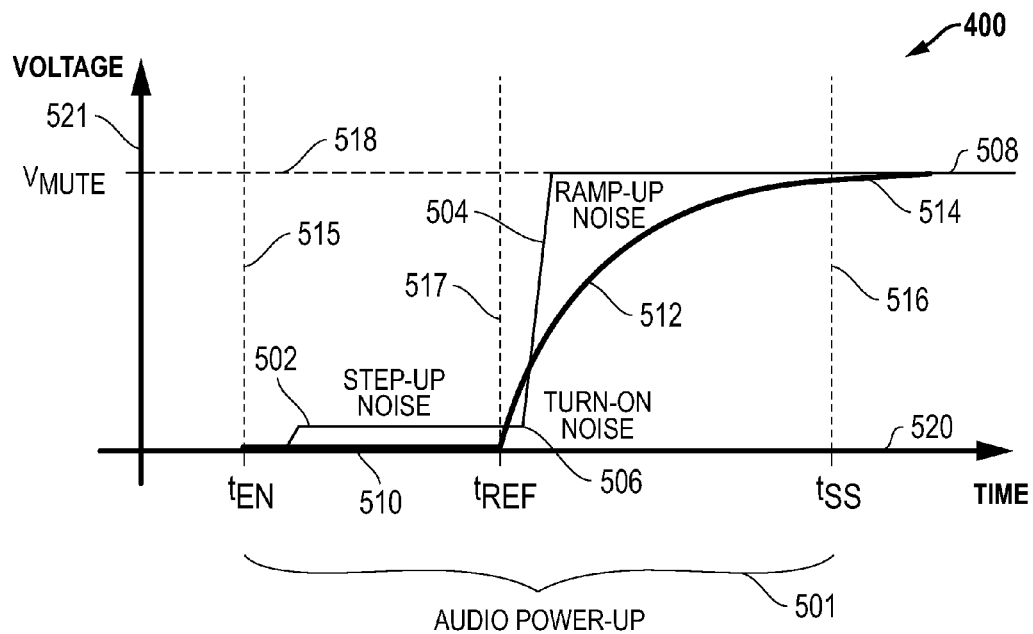
FIG. 4 is a wave form time diagram of an embodiment for audio output voltage signals as the audio output circuitry is powered-up for operation.

Before looking to the circuit diagrams provided in FIGS. 1-2, FIGS. 3-4 are first discussed. FIG. 3 provides a general block diagram of audio output circuitry having its audio output signal adjusted in part by reference voltage ($V_{REF}$) generator circuitry, bias current control circuitry, and/or voltage offset control circuitry to reduce and/or prevent audible pop/clock noise in the audio output signals during operational power-up or power-down. FIG. 4 is a wave form timing diagram of audio output signals adjusted by the pop/click reduction circuitry described herein. Without the pop/clock reduction circuitry described herein, the audio output signals will tend to have response features that lead to pop/click noise, such as voltage steps and/or sharp transitions that occur during operational power-up and power-down of the audio output circuitry. The pop/clock reduction circuitry described herein helps to reduce and/or prevent these noise producing features thereby reducing or preventing undesirable pop/clock noise.

Looking now to FIG. 3, a block diagram is provided of an embodiment 300 for audio output circuitry that operates to reduce audible pops and clicks in audio output signals. Audio input stage circuitry 150 generates an amplified output signal ($V_O$) 121 that is provided to audio output stage 320. Reference voltage ($V_{REF}$) generator circuitry 202 generates a reference voltage ($V_{REF}$) 218 that is provided to audio input stage 150, voltage offset control circuitry 302, and bias current control circuitry 330. As further described below, reference voltage ($V_{REF}$) 218 is controlled such that it is allowed to ramp to a steady-state voltage after operation is enabled for the audio input stage 150 and the audio output stage 320. The power-up control circuitry 404 provides the enable (EN_bar) signal 105 and the reference enable (REF_EN_bar) signal 212. These enable signals control when the operation of respective circuit blocks are enabled and powered-up and when the operation of respective circuit blocks are disabled and powered-down. As described further below, the reference voltage ($V_{REF}$) 218 helps to reduce or prevent audible pop/click noise. In addition, embodiment 300 includes voltage offset control circuitry 302 and bias current control circuitry 330. These additional circuit blocks also help reduce or prevent audible pops and clicks that may otherwise occur within audio signals generated by the amplifier circuitry, which includes input stage circuitry 150 and output stage circuitry 320 in embodiment 300. It is noted that more detailed circuit implementations are described in more detail with respect to FIG. 1 and FIG. 2 below.

For the embodiment 300 depicted, the reference voltage ($V_{REF}$) generator circuitry 202 receives a reference enable (REF_EN_bar) signal 212 and outputs a reference voltage ($V_{REF}$) signal 218 to audio input stage circuitry 150. The voltage offset control circuitry 302 receives the reference voltage ($V_{REF}$) signal 218 and outputs an offset signal (OFFSET) 310 to audio input stage circuitry 150. The bias current control circuitry 330 receives the reference voltage ($V_{REF}$) signal 218 and outputs a current control signal 350 to the audio output stage circuitry 320. In addition to the current control signal 350, the audio output stage circuitry 320 receives the output signal ($V_O$) 121 from the audio input stage circuitry 150 and provides the audio output signal ($V_{OUT}$) 122. The audio output signal ($V_{OUT}$) 122 can be used, for example, to drive a speaker to produce audible sounds for a user. It is noted that while the $V_{REF}$ generator circuitry 202, the voltage offset control circuitry 302, and the bias current control circuitry 330 are all shown for the embodiment 300, one or more of these functional circuit blocks could be utilized, as desired, to reduce the pop/click noise in the audio output signal ($V_{OUT}$) 122.

The power-up control circuitry 404 receives a supply voltage ($V_{DD}$) 104, provides an enable (EN_bar) signal 105 to the amplifier circuitry (e.g., input stage circuitry 150 and output stage circuitry 320), and provides the reference enable (REF_EN_bar) signal 212 to the $V_{REF}$ generator circuitry 202. When audio output signals are desired, the enable (EN_bar) signal 105 is first asserted to power-up the amplifier circuitry. The reference enable (REF_EN_bar) signal 212 is then asserted at a later time after a selected time delay. This time delay can be a few microseconds, such as 10 microseconds, if desired.

During operation, when a system including embodiment 300 first receives power such that a supply voltage ($V_{DD}$) 104 is generated and provided to embodiment 300, the power-up control circuitry 404 monitors the supply voltage ($V_{DD}$) 104. For example, power-up control circuitry 404 can provide the supply voltage ($V_{DD}$) 104 to inverter circuitry that will trigger an output state change when the supply voltage ($V_{DD}$) 104 reaches a threshold voltage. Once the supply voltage ($V_{DD}$) 104 reaches a threshold level, the power-up control circuitry 404 will de-assert the enable (EN_bar) signal 105 and will de-assert the reference enable (REF_EN_bar) signal 212. The de-assertion of these enable signals will cause the audio input stage circuitry 150, the audio output stage circuitry 320, and the reference voltage ($V_{REF}$) generator circuitry 202 to be initially powered-down and non-operational. When audio output signals are desired to be provided, the power-up control circuitry 404 will receive an audio enable signal 405, for example, from external control circuitry, and this audio enable signal 405 will indicate that audio output signals are to be enabled. The power control circuitry then asserts the enable (EN_bar) signal 105 to power-up the amplifier circuitry, which includes audio input stage circuitry 150 and the audio output stage circuitry 320 for embodiment 300. Then, after a time delay (e.g., 10 microseconds), the reference enable (REF_EN_bar) signal 212 is asserted to power-up the reference voltage ($V_{REF}$) generator circuitry 202, as described further with respect to FIG. 4 below.

It is noted that the designation "_bar" is used with respect to the enable (EN_bar) signal 105 and the reference enable (REF_EN_bar) signal 212. This "_bar" designation in this description is used to represent the over-bar designations in the drawings for these signals. The over-bar designation is used to refer to a signal that is asserted as a low logic level and de-asserted as a high logic level. While the enable (EN_bar) signal 105 and the reference enable (REF_EN_bar) signal 212 are shown in the example embodiments as asserted low, these signals could also be implemented as signals that are asserted as a high logic level and de-asserted as a low logic level, if desired.

FIG. 4 is a wave form timing diagram of an embodiment 400 for a representation of the audio output signal ($V_{OUT}$) 122 as the audio output circuitry is enabled and powered-up. The x-axis 520 represents time, and the y-axis 521 represents output voltage. The dashed line 515 represents a start time ($t_{EN}$) when the enable (EN_bar) signal 105 is asserted to enable operation of the audio amplifier circuitry. The dashed line 517 represents a time ($t_{REF}$) when the reference enable (REF_EN_bar) signal 212 is asserted to allow the reference voltage ($V_{REF}$) signal 218 to ramp up to a steady-state voltage. The dashed line 516 represents a time ($t_{SS}$) when a steady-state output DC voltage level (mute state) has been effectively achieved after an audio power-up time period 501. The mute state output DC voltage ($V_{MUTE}$) is indicated by dashed line 518. Although not shown, after the output voltage reaches this steady-state level, the volume (e.g., voltage level) of audio output signals may be progressively increased from the mute state to the desired output volume. For embodiment 400, the thick line 514 represents an output voltage response for an embodiment that utilizes the pop/click reduction circuitry described herein. The thin line 508 represents an output voltage response that would exist without the pop/click reduction circuitry described herein. As seen in FIG. 4, the response 514 provides a smoother transition to the mute state ($V_{MUTE}$) 518 than does the response 508. This smoother transition leads to the reduction/removal of pop/click noise within the audio output signal ($V_{OUT}$) 122 for the embodiment described herein.

Looking in more detail to FIG. 4, pop/click noise in the audio output can occur due to one or more features of the response 508. First, when the audio input stage circuitry 150 and audio output stage 320 are first enabled at time ($t_{EN}$) 515, a positive step-up 502 and associated step-up noise can occur due to undesired offsets. Second, when the reference voltage generator circuitry 202 is enabled at time ($t_{REF}$) 517, a sharp-corner 506 and associated turn-on noise can occur. Third, as the output voltage ($V_{OUT}$) 122 rises to the mute state ($V_{MUTE}$) 518 based upon the rise of the reference voltage ($V_{REF}$) signal 218, a sharp ramp-up 504 and associated ramp-up noise can occur if the reference voltage ($V_{REF}$) signal 218 is allowed to quickly ramp up to a steady state level. Other sources of pop/click noise could also occur.

In contrast with response 508, the response 514 associated with the embodiments described herein reduce and/or prevent the pop/click noise caused by the initial step-up 502, the sharp turn-on corner 506, and the sharp ramp-up 504. In particular, the sharp turn-on corner 506 and sharp ramp-up 504 are reduced by the reference voltage ($V_{REF}$) signal 218 applied to the audio input stage circuitry 150 by the $V_{REF}$ generator 202, because the reference voltage ($V_{REF}$) 218 ramps-up smoothly according to a gradual RC (resistance-capacitance) time constant, as described in more detail with respect to FIG. 1 below. Thus, instead of the sharp turn-on corner 506 and the sharp ramp-up 504, a smooth transition 512 is achieved from about ground to the mute state ($V_{MUTE}$) 518. Further, the initial step-up 502 is reduced by the negative voltage offset (OFFSET) 310 applied to the voltage input stage circuitry 150 by the voltage offset control circuitry 302, as described in more detail with respect to FIG. 2 below. The initial step-up 502 is also reduced through control of the bias control current 350 that is generated by the bias current control circuitry 330 and applied to the audio output stage circuitry 320, as described in more detail with respect to FIG. 2 below. Advantageously, instead of the step-up 502, which can cause a pop/click noise, a reduced voltage level 510 is achieved that is either at ground or negligibly above ground.

Now looking to FIG. 1, a circuit diagram is provided of an example embodiment 100 that includes audio input stage circuitry 150 as the amplifier circuitry and includes reference voltage ($V_{REF}$) generation circuitry 202. The audio input stage circuitry 150 generates an output signal ($V_O$) 121 and includes a voltage amplifier 102 that is connected between a positive supply voltage ($V_{DD}$) 104 and ground ($V_{SS}$) 106 (e.g., 0 volts). For the embodiment 100 depicted, the voltage amplifier 102 has a negative input (−) 108 and a positive input (+) 110. The differential audio input signal includes a negative voltage input ($V_N$) 112 and a positive voltage input ($V_P$) 114. The negative voltage input ($V_N$) 112 is provided to the negative input (−) 108 for the voltage amplifier 102 through an input resistor ($R_N$) 116. The positive voltage input ($V_P$) 114 is provided to the positive input (+) 110 for the voltage amplifier 102 through an input resistor ($R_P$) 118. In addition to these input resistors, a feedback resistor ($R_{FB}$) 120 is connected between the output signal ($V_O$) 121 and the negative input (−) 108 of the voltage amplifier 102.

Reference voltage ($V_{REF}$) generation circuitry 202 provides a reference voltage ($V_{REF}$) signal 218 to the amplifier 102. In particular, as depicted, the reference voltage ($V_{REF}$) signal 218 is provided through resistor ($R_{REF}$) 216 to the positive input (+) 110 for the amplifier 102. The $V_{REF}$ generator circuitry 202 includes a reference current generator ($I_{REF1}$) 204, a reference resistor ($R_{REF1}$) 206, an enable transistor ($M_{EN}$) 210, and a reference voltage amplifier 214. The reference current generator ($I_{REF1}$) 204 is connected between the positive supply voltage ($V_{DD}$) 104 and a first reference voltage node ($V_{REF1}$) 208, and the reference resistor ($R_{REF1}$) 206 is connected between the first reference voltage node ($V_{REF1}$) 208 and ground ($V_{SS}$) 106. The reference voltage amplifier 214 has its positive input (+) connected to the first reference voltage node ($V_{REF1}$) 208 and has its negative input (−) connected to its output. The first reference voltage node ($V_{REF1}$) 208 is also connected to a reference capacitor ($C_{REF1}$) 130.

It is noted that the capacitance ($C_{REF1}$) 130 can be implemented as a capacitor that is located externally to other circuitry for the reference voltage ($V_{REF}$) generation circuitry 202, as indicated by capacitor ($C_{REF1}$) 130 being located outside the dashed line for the reference voltage ($V_{REF}$) generation circuitry 202. For some embodiments, the capacitor ($C_{REF1}$) 130 can be implemented as a capacitor located externally to an integrated circuit that includes the reference voltage generator circuitry 202 and/or embodiment 100, if desired. Alternatively, capacitor ($C_{REF1}$) 130 can be implemented as part of the $V_{REF}$ generation circuitry 202, if desired, or combination of an internal and external capacitance can be utilized. It is further noted that capacitor ($C_{REF1}$) 130 can be used for an additional functional purpose, for example, as a system ground coupling capacitor.

As described above, the reference enable (REF_EN_bar) signal 212 is used to enable operation of the $V_{REF}$ generation circuitry 202. For the embodiment 100 depicted, an enable transistor ($M_{EN}$) 210 has its gate connected to the reference enable (REF_EN_bar) signal 212 and has its drain and source connected between a first reference voltage node ($V_{REF1}$) 208 and ground ($V_{SS}$) 106. As depicted, the enable transistor ($M_{EN}$) 210 is an NMOS (n-channel metal oxide semiconductor) transistor. As such, when the reference enable (REF_EN_bar) signal 212 is de-asserted at a high logic level, the enable transistor ($M_{EN}$) 210 will turn on and hold the voltage on the first reference voltage node ($V_{REF1}$) 208 to ground ($V_{SS}$) 106. When the reference enable (REF_EN_bar) signal 212 is asserted at a low logic level, the enable transistor ($M_{EN}$) 210 will turn off and allow the voltage on the first reference voltage node ($V_{REF1}$) 208 to rise to a steady-state level.

As indicate above, the enable (EN_bar) signal 105 is initially de-asserted to keep the amplifier circuitry powered-down, and the reference enable (REF_EN_bar) signal 212 is initially de-asserted to hold the first reference voltage node ($V_{REF1}$) 208 to ground ($V_{SS}$) 106. For audio power-up, the enable (EN_bar) signal 105 is first asserted to power-up the audio input stage circuitry 150. After a time delay (e.g., 10 microseconds), reference enable (REF_EN_bar) signal 212 is then asserted to allow the first reference voltage node ($V_{REF1}$) 208 to rise to a steady state voltage level. As described further below, the reference voltage ($V_{REF}$) signal 218 will similarly rise, as the reference amplifier 214 operates as a buffer. Thus, once the reference voltage ($V_{REF}$) generator circuitry 202 is enabled, a time-varying reference voltage ($V_{REF}$) signal 218 is applied to the input of the voltage input stage circuitry 150. This time-varying reference voltage ($V_{REF}$) signal 218 helps reduce or prevent audible pop/click noise from occurring due to sharp turn-on and ramp-up noise of the initial audio output levels that may otherwise occur, as described with respect to FIG. 4 above. As recognized with respect to the embodiments described herein, it is advantageous to enable the reference voltage ($V_{REF}$) generator circuitry 202 after the audio amplifier circuitry is enabled. If the audio input stage circuitry 150 and the reference voltage ($V_{REF}$) generation circuitry 202 were enabled at the same time, output signal ($V_O$) 121 may have an audible step due to potential delays in power-up of the audio amplifier circuitry and due to the reference voltage ($V_{REF}$) signal 218 quickly ramping to a voltage level well above ground level.

For embodiment 100, the voltage reference voltage ($V_{REF}$) signal 218 will follow the voltage on the first reference voltage node ($V_{REF1}$) 208. Thus, after the reference voltage ($V_{REF}$) generator circuitry 202 is enabled through assertion of the reference enable (REF_EN_bar) signal 212, the voltage on the first reference voltage node ($V_{REF1}$) 208, and thus the voltage of the reference voltage ($V_{REF}$) signal 218, will rise from a low reference voltage ($V_{SS}$) 106 to a higher steady-state voltage. The speed at which the voltage on node 208 rises is dependent upon an RC (resistance-capacitance) time constant that is determined by the reference resistor ($R_{REF1}$) 206 and the reference capacitor ($C_{REF1}$) 130. The reference amplifier 214 effectively operates to buffer the time-varying voltage on the first reference voltage node ($V_{REF1}$) 208 and provides the time-varying reference voltage ($V_{REF}$) signal 218 as an output. Thus, the time-varying reference voltage ($V_{REF}$) signal 218 will also rise from ground ($V_{SS}$) 106 to a steady-state voltage according to the RC time constant that is determined by the reference resistor ($R_{REF1}$) 206 and the reference capacitor ($C_{REF1}$) 130. Advantageously, the RC time constant leads to a smoother response for the time-varying reference voltage ($V_{REF}$) signal 218 and thereby to a smoother response for the audio output signals, such as represented with respect to curve 512 in FIG. 4.

It is noted that during operational power-up, the voltage on the first reference voltage node ($V_{REF1}$) 208 is generated by current flowing from the reference current ($I_{REF1}$) 204 into the resistor ($R_{REF1}$) 206. For interference and noise reasons, the reference current ($I_{REF1}$) 204, the reference resistor ($R_{REF1}$) 206, and the capacitor ($C_{REF1}$) 130 can be chosen so that circuit noise is low pass filtered and therefore attenuated inside the audio band. It is further noted that the reference capacitor ($C_{REF1}$) 130 can be chosen to be large enough so that the ramp pop/click noise will be significantly attenuated in the audio band and, more particularly, noise in the lower part of the audio band frequency range (e.g., around 20 Hz). For example, the reference capacitor ($C_{REF1}$) 130 can be about 10 uF, if desired, and the ramp for the reference voltage ($V_{REF1}$) 218 from ground to a steady state voltage can be configured to be about 100 milliseconds, if desired. Other values could also be used for the capacitance and the ramp rate, as desired.

It is further noted that the output signal ($V_O$) 121 for embodiment 100 is a function of the reference voltage ($V_{REF}$) signal 218 and the input voltage ($V_{IN}$) to the voltage amplifier 102. The input voltage ($V_{IN}$) is the differential signal created by the positive input voltage ($V_P$) 114 and the negative input voltage ($V_N$) 112. This input voltage ($V_{IN}$) can be represented by the equation: $V_{IN}=V_P-V_N$. The output signal ($V_O$) 121 can be represented as follows:

$$V_O=V_{REF}-[(R_{FB}/R_{IN})\cdot V_{IN}]$$

where $R_{IN}=R_P=R_N$ and where $R_{REF}=R_{FB}$

As depicted in the above equation, the output voltage ($V_O$) 121 is based upon the addition of the reference voltage ($V_{REF}$) signal 218 and the differential input ($V_{IN}$) to the voltage amplifier 102. It is further noted that the addition of the reference voltage ($V_{REF}$) signal 218 allows for local ground to be noisier when referred to an external system load ground, thereby avoiding performance degradation.

During operation of the embodiment 100, the reference enable (REF_EN_bar) signal 212 is initially de-asserted so that transistor ($M_{EN}$) 210 turns on and holds the first reference voltage ($V_{REF1}$) 208 to the low voltage reference ($V_{SS}$) 106 (e.g., ground). When the reference enable (REF_EN_bar) signal 212 is asserted, as represented by time ($t_{REF}$) 517 in FIG. 4, transistor ($M_{EN}$) 210 will turn off. Once transistor ($M_{EN}$) 210 is turned off, the voltage on the first voltage reference node ($V_{REF1}$) 208 and thereby the reference voltage ($V_{REF}$) signal 218 will smoothly ramp up according to an inverted exponential as represented by curve 512 in FIG. 4. As described above, the inverted exponential is determined by an RC time constant, which is in turn determined by the values for the capacitance ($C_{REF1}$) 130 and the resistance ($R_{REF1}$) 206. If desired, this RC time constant can be configured to provide a rise time of about 100 milliseconds from ground ($V_{SS}$) 106 to a steady-state value, which is represented by the mute output voltage level ($V_{MUTE}$) 518 in FIG. 4. As indicated above, the voltage reference ($V_{REF}$) signal 218 is a buffered version of the voltage on the first reference voltage node ($V_{REF1}$) 208 and, therefore, follows the smooth transition of this voltage. Because the output voltage ($V_O$) 121 is the result of the addition of the reference voltage ($V_{REF}$) signal 218 with the differential input voltage ($V_N/V_P$) 112/114 and the ramp of the reference voltage ($V_{REF}$) signal 218 starts after the audio input stage circuitry 150 is enabled, the output voltage ($V_O$) 121 from voltage amplifier 102 will also smoothly ramp up until it reaches the mute state ($V_{MUTE}$) 518, as shown in FIG. 4.

It is noted that sound volume, which can be represented by the average differential input voltage ($V_N/V_P$) 112/114 connected to the voltage amplifier 102 through $R_P/R_N$ resistors 118/116, is usually zero (e.g., no differential input signal applied) during operational power-up of the audio output circuitry. If desired, this sound volume can be slowly ramped up when the reference voltage ($V_{REF}$) signal 218 is close to its final steady state value. This slow ramp of the sound volume further helps to reduce audible pop/click noise within the audio output ($V_{OUT}$) 122 when providing an audio input signal after operational power-up of the audio output circuitry.

For the embodiment depicted, it is again noted that the reference enable (REF_EN_bar) signal 212 will be asserted to allow the first reference voltage ($V_{REF1}$) 208 to rise only after a time delay from the assertion of the enable (EN_bar) signal 105. This sequence helps to avoid supply ramp transients introducing audible pop/click noise within the output signal ($V_O$) 121, because the output amplifier 102 will be forcing the audio output voltage ($V_{OUT}$) 121 to ground ($V_{SS}$) 106 thereby not allowing that voltage to diverge to an uncontrolled higher voltage levels due to power-up transients.

As described above, the smooth transition achieved by applying the reference ($V_{REF}$) signal 218 and its associated RC time-constant to the voltage amplifier 102 advantageously reduces audible pop/click noise in the output signal ($V_O$) 121. However, some embodiments may still have initial voltage offsets that lead to undesirable pop/click noise. For example, when the first reference voltage ($V_{REF1}$) 208 is tied to ground ($V_{SS}$) 106 (e.g., 0 volts), this may cause the reference voltage signal ($V_{REF}$) 218 from the voltage amplifier 214 to be above 0 volts by an appreciable amount due to an offset in the reference amplifier 214. This offset and other offsets may add up and cause the output signal ($V_O$) 121 from the voltage amplifier 102 to be appreciably above 0 volts when the amplifier 102 is enable, as represented by the step-up 502 in FIG. 4. This step-up is often large enough to produce an undesired pop/click sound.

FIG. 2 a detailed circuit diagram of an embodiment 200 that includes voltage offset control circuitry 302 and bias current control circuitry 330 that can be used to reduce and/or prevent this step-up noise. Voltage offset control circuitry 302 applies an offset (OFFSET) signal 310 to the audio input stage circuitry 150 that helps to reduce and/or eliminate the step-up 502 in FIG. 4. Further, the bias current control circuitry 330 generates current control signal 350 that is applied to the output stage circuitry 320 to control output current and thereby help to reduce and/or eliminate the step-up 502 in FIG. 4. During operation, therefore, the offset (OFFSET) signal 310 and the bias current control signal 350 help to reduce or prevent audible pop/click noise from occurring due to step-up noise of the initial audio output levels, as described with respect to FIG. 4 above.

For the embodiment 200 depicted, the offset (OFFSET) signal 310 from the voltage offset control circuitry 302 is applied to the positive input (+) 110 for the voltage amplifier 102 within the audio input stage circuitry 150. The voltage offset control circuitry 302 includes transistor (M6) 304, transistor (M7) 306, transistor (M9) 308, and current source (I3) 310. Current source (I3) 310 is connected between the supply voltage ($V_{DD}$) 104 and node 311. Transistor (M9) 308 has its gate connected to the voltage reference ($V_{REF}$) signal 218 and has its source and drain connected between node 311 and ground ($V_{SS}$) 106. Transistor (M7) 306 has its drain and gate connected to node 311 and its source connected to the ground ($V_{SS}$) 106. Transistor (M6) 304 has its source connected to ground ($V_{SS}$) 106, has its gate connected to node 311, and has its drain connected to provide the current offset (OFFSET) signal 310 to the positive input (+) 110 for the voltage amplifier 102 within the audio input stage circuitry 150. It is noted that for the embodiment depicted, transistor (M6) 304, transistor (M7) 306, and transistor (M9) 308 are NMOS transistors.

During operational power-up of the audio output circuitry, the voltage on node 311 provides a bias current to transistor (M6) 304. A current will flow through transistor (M6) 304 to provide the offset (OFFSET) signal 310 based upon the current mirror provided by transistor (M7) 306 and transistor (M6) 304. This offset (OFFSET) signal 310 will remove current from the positive input (+) 110 for the voltage amplifier 102, thereby effectively providing a negative voltage offset to remove step-up voltages, such as step-up 502 in FIG. 4. As described further below, this negative voltage offset results in a lower voltage level, such as lower level 510 in FIG. 4, thereby reducing or eliminating step-up pop/click noise that would otherwise be caused within the audio output signals. When the reference voltage ($V_{REF}$) signal 218 rises to a sufficient level to turn on transistor (M9) 308, current flowing into transistor (M7) 306 through node 311 will be progressively diverted to the ground ($V_{SS}$) 106, thereby reducing the amplitude of the offset current signal (OFFSET) and effectively disabling the voltage offset generation circuitry 302.

Introducing the negative offset using the voltage offset control circuitry 302 advantageously causes the audio output signal ($V_{OUT}$) 122 to be tied more closely to the ground, thereby reducing the step-up 502 as shown in FIG. 4. In particular, the high gain of the voltage amplifier 102 will overdrive the gate of transistor (M1) 322 to a high enough voltage level so that the drain-to-source resistance of transistor (M1) 322 will be very low. Transistor (M1) 322, therefore, will hold the audio output voltage ($V_{OUT}$) 122 to a low voltage, as shown by low voltage section 510 in FIG. 4.

As described above, the introduction of a negative offset signal (OFFSET) 310 is based on the operation of current source transistor (M6) 304 pulling out a small current from the positive input (+) 110 for the voltage amplifier 102. Once steady state operation is reached, the current source transistor (M6) 304 is shut down. In particular, the removal of the negative offset signal (OFFSET) 310 occurs when the reference voltage ($V_{REF}$) signal 218 reaches a value above the threshold voltage of transistor (M9) 308, at which time transistor (M9) 308 drives node 311 to ground ($V_{SS}$) 106. The negative offset signal (OFFSET) 310 provided by current source transistor (M6) 304 is then gradually removed. The size of transistor (M9) 308 can be selected, if desired, to provide a smooth transition and thereby reduce possible audible pop sounds. When the reference voltage ($V_{REF}$) signal 218 reaches its steady state level, the current from current source (I3) 310 is fully diverted to ground through transistor (M9) 308, and the negative offset signal (OFFSET) 310 is effectively removed. At this time, current source (I3) 310 can be tuned off to save current consumption, as node 311 has been pulled to ground.

Looking back to embodiment 200 in FIG. 2, the voltage amplifier output stage circuitry 320 receives output signal ($V_O$) 121 and provides the audio output signal ($V_{OUT}$) 122. The output stage circuitry 320 also receives the current control signal 350 from the bias current control circuitry 330. The output stage circuitry 320 includes transistor (M1) 322, transistor (M4) 324, transistor (M5) 326, and current source (I2) 328. The current source (I2) 328 is connected between node 327 and ground ($V_{SS}$) 106. Transistor (M5) 326 has its source and drain connected between the positive supply voltage ($V_{DD}$) 104 and node 327. The gate for transistor (M5) 326 and the gate for transistor (M4) 324 are also connected to node 327. Transistor (M4) 324 has its source connected to the positive supply voltage ($V_{DD}$) 104 and has its drain connected to node 323. Transistors (M4/M5) 324 and 326 provide a current mirror that mirrors the current from current source (I2) 328 into node 323. The transistor (M1) 322 has its gate connected to the output signal ($V_O$) 121, has its drain connected to node 323, and has its source connected to the ground supply voltage ($V_{SS}$) 106. The audio output signal ($V_{OUT}$) 122 and the current control signal 350 are also connected to node 323. It is noted that for the embodiment depicted, the feedback resistor ($R_{FB}$) 120 is coupled between the negative input node (−) 108 and node 323; transistor (M1) 304 is an NMOS transistor; and transistors (M4) 324 and (M5) 326 are PMOS (p-channel metal oxide semiconductor) transistors. Other circuitry may also be included, if desired, to perform additional functions. For example, additional circuitry could also be included to provide frequency stabilization of the voltage amplifier 102.

The bias current control circuitry 330 provides the current control signal 350 to the output circuitry 320. The bias current control circuitry 330 includes transistor (M8) 332, transistor (M10) 334, transistor (M11) 336, transistor (M12) 340, transistor (M3) 342, transistor (M2) 344, resistor (R1) 338, and current source (I1) 346. Transistor (M8) 322 has its gate connected to the voltage reference ($V_{REF}$) signal 218 and its source and drain connected between node 333 and ground ($V_{SS}$) 106. Transistor (M10) 334 has its source connected to the supply voltage ($V_{DD}$) 104 and has its gate and drain connected to node 333 to provide a bias voltage to the gate of transistor (M11) 336. In addition to having its gate connected to node 333, transistor (M11) 336 has its source connected to the supply voltage ($V_{DD}$) 104 and has its drain connected to node 337. Transistors (M10) 334 and (M11) 336 provide a current mirror that mirrors the current from transistor (M8) 332 into resistor (R1) 338. Resistor (R1) 338 is connected between node 337 and ground ($V_{SS}$) 106. Transistor (M12) 340 has its gate connected to node 337, its source connected to the positive voltage supply ($V_{DD}$) 104, and its drain connected to node 341. Current source (I1) 346 is connected between node 341 and ground ($V_{SS}$) 106. Transistor (M3) 342 has its source connected to the positive supply voltage ($V_{DD}$) 104 and has its drain and gat connected to node 341 to provide a bias voltage to the gate of transistor (M2) 344. In addition to having its gate connected to node 341, transistor (M2) 344 has its source connected to the positive supply voltage ($V_{DD}$) 104 and has its drain connected to node 323 to provide the current control signal 350. Transistors (M3/M2) 342 and 344 provide a current minor that minors the current from the current source (I1) 346 subtracted by the current flowing through (M12) 340 to the drain of transistor (M3) 342.

During operation, the voltage on node 327 will provide a small fixed bias current to transistor (M4) 324. Transistor (M4) 324 will then operate with driver transistor (M1) 322 to provide the audio output signal ($V_{OUT}$) 122. Initially, node 337 will be tied to ground through resistor (R1) 338, thereby turning on transistor (M12) 340, tying node 341 to the supply voltage ($V_{DD}$) 104, and diverting current from current source (I1) 346 to the positive supply voltage ($V_{DD}$) 104. Consequently, the current minor provided by transistors (M3) 342 and (M2) 344 will not supply any additional current to the drain of transistor (M1) 322. When the voltage reference ($V_{REF}$) signal 218 rises to a sufficient level to turn on transistor (M8) 332, a bias voltage is provided on node 333 that turns on transistor (M11) 336. When transistor (M11) 336 turns on, the voltage on node 337 rises and progressively turns off transistor (M12) 340. While transistor (M12) 340 is progressively turning off, the bias voltage 341 to transistor (M2) is also being adjusted, thereby allowing transistor (M2) 344 to increase the current control signal 350 to node 323 and into the drain of transistor (M1) 322. When the voltage reference ($V_{REF}$) signal 218 rises to a sufficient level to fully turn on transistor (M8) 332, the drive current weakening provided by transistor (M12) 340 is effectively disabled. The dynamic performance of the audio voltage amplifier is then increased to the desired level.

It is noted that during initial power-up, only a small fraction of the nominal current for transistor (M2) 344 is provided as bias current through transistor (M4) 324 to sustain the audio output signal ($V_{OUT}$) 122 into the drain of transistor (M1) 322. With this lower biasing current, transistor (M1) 322 is able to keep the audio output voltage ($V_{OUT}$) 122 initially at close to ground and, therefore, reduce or eliminate the power-up step that would cause an audible and undesired pop sound, as represented by step-up 502 in FIG. 4. This lower voltage level is illustrated as element 510 of FIG. 4.

It is further noted that during power-up, this biasing current for transistor (M1) 322 transitions from having current provided solely from transistor (M4) 324 to current provided from transistor (M4) 324 and transistor (M2) 344. This transition is provided by smoothly releasing the shunt created by transistor (M12) 340 between the positive supply voltage ($V_{DD}$) 104 and node 341. Transistor (M8) 332, transistor (M10) 334, transistor (M11) 336, transistor (M12) 340, and resistor (R1) 338 are used to shunt current on node 341, thereby controlling the current control signal 350 provided to node 323. It is also noted that the sizes for these devices can be selected, if desired, to provide a smooth transition of transistor (M2) 344 from an off state to an on state so as to reduce undesired audible pop sounds from being generated.

When the audio output circuitry is in steady operation and needs to be powered down, the process for power-down is essentially based on a reverse sequence from the power-up procedure described herein. This power-down sequence avoids the generation of pop and/or clicks at the audio output voltage ($V_{OUT}$) 122 during power-down.

The first step in the power-down sequence is to progressively reduce the audio output volume until it reaches the mute state (e.g., zero voltage gain) for the audio input stage 150. When at the mute state, the current source ($I_{REF1}$) 204 is turned off. The first reference voltage node ($V_{REF1}$) 208 and the voltage reference ($V_{REF}$) signal 218 will then ramp down to ground voltage level ($V_{SS}$) 106 according to an inverted exponential shape based upon the RC time constant as the charge stored in capacitor ($C_{REF1}$) 130 will smoothly discharge through resistor ($R_{REF1}$) 206, thereby providing a smooth slope that reduces and/or prevents audible pop and/or click sounds.

When the voltage reference ($V_{REF}$) signal 218 decreases to a level where transistor (M8) 332 starts to progressively turn off, this will reduce the current biasing of transistor (M10) 334, increase the voltage at node 337, and increase the shunt current in transistor (M12) 340. More current will then be diverted from current source (I1) 346 to the positive voltage supply ($V_{DD}$) 104, thereby reducing the bias of transistor (M3) 342. This reduction will in turn reduce the level of the current control signal 350 to node 323 and thereby decrease the output drive strength for the transistor (M1) 322. This output drive strength will become progressively defined by transistor (M4) 324 alone. This decrease provides a lower biasing current into transistor (M1) 322 which makes it easier for transistor (M1) 322 to short the audio output signal ($V_{OUT}$) 122 to the ground ($V_{SS}$) 106, thereby reducing and/or preventing undesired pop and/or click sounds.

If current source (I3) 310 has been turned off to save power, it is turned back on while the voltage reference ($V_{REF}$) signal 218 is still at its steady state level and before starting the power-down sequence. This turning on of current source (I3) 310 will not produce pop and/or click sound because transistor (M9) 308 is strongly tuned on by the reference voltage ($V_{REF}$) signal 218, effectively diverting all the current to ground ($V_{SS}$) 106. When the voltage reference ($V_{REF}$) signal decreases to a level where transistor (M9) 308 starts to progressively turn off, the bias current of transistor (M7) 306 will be reduced as less current from current source (I3) 310 will be progressively diverted to the ground ($V_{SS}$) 106. As such, the offset current signal (OFFSET) 310 provided by the current mirror including transistors (M7) 306 and (M6) 304 is progressively increased. This increase effectively introduces sufficient negative offset to the output audio circuitry so that when the reference voltage ($V_{REF}$) signal 218 reaches the ground voltage level, any inherent potential positive offsets are superseded by the negative offset signal (OFFSET) 310. Thus, the audio output voltage ($V_{OUT}$) 122 will be tightly and smoothly tied to ground voltage level, thereby preventing or reducing pop and/or click sounds.

When the reference voltage ($V_{REF}$) signal 218 reaches the ground ($V_{SS}$) 106, the reference voltage ($V_{REF}$) generation circuitry 202 is effectively powered down, and the audio output signal ($V_{OUT}$) 122 will be pulled to ground. At a time delay from the de-assertion of the reference enable (REF_EN_bar) signal 212 that allows the reference voltage ($V_{REF}$) signal 218 to reach ground ($V_{SS}$) 106, the enable (EN_bar) signal 105 is de-asserted to power-down the amplifier circuitry. The power-down of the amplifier circuitry reduces current consumption without generating pop/click noise as the audio output signal ($V_{OUT}$) 122 is already tied to the ground voltage supply ($V_{SS}$) level.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein and certain features of the invention may be utilized independently of the use of other features, all as would be apparent to one skilled in the art after having the benefit of this description of the invention.

What is claimed is:
1. Audio output circuitry, comprising:
a reference voltage generator circuitry configured to output a reference voltage that rises from a first voltage level to a second voltage level after a reference enable signal is asserted;
amplifier circuitry configured to produce an amplified audio output signal based upon a combination of an audio input signal and the reference voltage, the audio output circuitry being further configured to power-up based upon assertion of an enable signal; and
power-up control circuitry configured to assert the enable signal to power-up the audio output circuitry and to assert the reference enable signal after a time delay from the assertion of the enable signal.

2. The audio output circuitry of claim 1, wherein the first voltage level is ground and the second voltage level represents a mute voltage level for the audio output circuitry.

3. The audio output circuitry of claim 1, wherein the amplifier circuitry comprises a differential amplifier, wherein the audio input signal is a differential audio input signal, and wherein the reference voltage is applied to a positive input for the differential amplifier.

4. The audio output circuitry of claim 1, wherein the reference voltage is configured to rise at a rate dependent upon an RC (resistance-capacitance) time constant based upon a resistance and a capacitance.

5. The audio output circuitry of claim 4, wherein the reference voltage generator circuitry comprises a reference amplifier having an input coupled to a first node and an output configured to provide the reference voltage and further comprises a resistor coupled to the first node to provide at least in part the resistance.

6. The audio output circuitry of claim 5, wherein the first node is configured to be coupled to a capacitor to provide at least in part the capacitance, wherein the reference voltage generator circuitry is located on an integrated circuit, and wherein the capacitor is located external to the integrated circuit.

7. The audio output circuitry of claim 1, further comprising negative offset control circuitry configured to provide a negative offset signal to the amplifier circuitry to reduce an input level for the audio input signal during power-up of the amplifier circuitry.

8. The audio output circuitry of claim 7, wherein the negative offset control circuitry is coupled to the reference voltage and is configured to disable the negative offset signal when the reference voltage has risen to the second voltage level.

9. The audio output circuitry of claim 1, further comprising current control circuitry coupled to the amplifier circuitry and configured to reduce output drive current during power-up of the amplifier circuitry to hold audio output signals from the amplifier circuitry at low voltage levels.

10. The audio output circuitry of claim 9, wherein the current control circuitry is coupled to the reference voltage and is configured to progressively disable output drive current reduction as the reference voltage rises to the second voltage level.

11. The audio output circuitry of claim 10, wherein the amplifier circuitry comprises input stage circuitry and output stage circuitry, and wherein the current control circuitry is provided to the output stage circuitry.

12. The audio output circuitry of claim 1, wherein the reference voltage generator circuitry is configured to allow the reference voltage to fall from the second voltage level to the first voltage level after the reference enable signal is de-asserted.

13. The audio output circuitry of claim 12, wherein for power-down of the audio output circuitry, the power-up control circuitry is configured to first de-assert the reference enable signal and then after a time delay to de-assert the enable signal to power-down the amplifier circuitry.

14. A method for providing amplified audio output signals, comprising:
  asserting an enable signal to amplifier circuitry to power-up the amplifier circuitry, the amplifier circuitry providing an amplified audio output signal based upon a combination of an audio input signal and a reference voltage;
  after a selected time delay from the assertion of the enable signal, asserting a reference enable signal to reference voltage generator circuitry, the reference voltage generator circuitry providing the reference voltage; and
  using the reference voltage generator circuitry to ramp the reference voltage from a first voltage level to a second voltage level.

15. The method of claim 14, wherein the first voltage level is ground and the second voltage level represents a mute voltage level for the audio output circuitry.

16. The method of claim 14, wherein the reference voltage is configured to rise at a rate dependent upon an RC (resistance-capacitance) time constant based upon a resistance and a capacitance.

17. The method of claim 14, further comprising applying a negative offset to the amplifier circuitry to reduce an input level for the audio input signal during power-up of the amplifier circuitry.

18. The method of claim 17, further comprising disabling the negative offset signal when the reference voltage has risen to the second voltage level.

19. The method of claim 14, further comprising applying a current control signal to the amplifier circuitry to reduce output drive current during power-up of the amplifier circuitry.

20. The method of claim 19, further comprising progressively disabling the output current reduction when the reference voltage has risen to the second voltage level.

21. The method of claim 14, further comprising de-asserting the reference enable signal to the reference voltage generator circuitry and using the reference voltage generator circuitry to drop the reference voltage from the second voltage level to the first voltage level.

22. The method of claim 21, further comprising for power-down of the audio output circuitry, first de-asserting the reference enable signal and then after at a time delay de-asserting the enable signal to power-down the amplifier circuitry.

* * * * *